United States Patent [19]
Dalal et al.

[11] Patent Number: 5,434,451
[45] Date of Patent: Jul. 18, 1995

[54] TUNGSTEN LINER PROCESS FOR SIMULTANEOUS FORMATION OF INTEGRAL CONTACT STUDS AND INTERCONNECT LINES

[75] Inventors: Hormazdyar M. Dalal, Milton; Kevin J. Hutchings, Middletown; Hazara S. Rathore, Stormville, all of N.Y.

[73] Assignee: International Business Machines Corporation, Armonk, N.Y.

[21] Appl. No.: 5,961

[22] Filed: Jan. 19, 1993

[51] Int. Cl.$^6$ .................. H01L 23/485; H01L 21/44
[52] U.S. Cl. .................. 257/768; 437/187; 437/192; 437/194; 437/197
[58] Field of Search ............ 437/187, 189, 192, 197, 437/203, 944, 948, 194; 148/DIG. 25, DIG. 26, DIG. 100, DIG. 143; 257/768, 769, 770, 774, 485, 486

[56] References Cited

U.S. PATENT DOCUMENTS

| | | | |
|---|---|---|---|
| 4,029,562 | 6/1977 | Feng et al. | 156/656 |
| 4,214,256 | 7/1980 | Dalal et al. | 357/71 |
| 4,410,622 | 10/1983 | Dalal et al. | 156/646 |
| 4,519,872 | 5/1985 | Anderson, Jr. et al. | 156/643 |
| 4,884,123 | 11/1989 | Dixit et al. | 437/192 |
| 5,008,216 | 4/1991 | Huang et al. | 437/189 |

FOREIGN PATENT DOCUMENTS

| | | |
|---|---|---|
| 0453644 | 6/1980 | European Pat. Off. . |
| 0279588 | 8/1988 | European Pat. Off. ............ 437/190 |
| 0425787 | 5/1991 | European Pat. Off. . |
| 0506129 | 9/1992 | European Pat. Off. . |
| 3021206 | 12/1990 | Germany . |
| 274715 | 11/1987 | Japan .................. 437/192 |

OTHER PUBLICATIONS

Ellwanger, et al. "An Integrated Aluminum/CVD-W Metallization Process" 1991 Proc. 8th International IEEE VLSI Multilevel Interconnect Conf. (Jun. 11-12, 1991) pp. 41-50.

*Primary Examiner*—George Fourson
*Assistant Examiner*—C. Everhart
*Attorney, Agent, or Firm*—Whitham, Curtis, Whitham & McGinn; Charles W. Peterson

[57] ABSTRACT

Tungsten studs and tungsten lined studs that make low resistance thermally stable ohmic or Schottky contacts to active devices on a semiconductor substrate are made by first defining a triplex metallurgical structure. The triplex metallurgical structure includes an ohmic layer, a barrier layer and a sacrificial layer. Then, a blanket layer of insulator is deposited and polished, or etched, or both, until the stud metallurgy is exposed. The sacrificial layer is then etched out, leaving holes self-aligned to the contacts and to the ohmic and the barrier layers. A blanket layer of CVD tungsten is then deposited and the substrate is polished, or etched, or both, to remove excess tungsten. The metal contact studs can be simultaneously formed with patterned interconnection lines which are self-aligned to each other and also to the contact studs.

17 Claims, 9 Drawing Sheets

TUNGSTEN LINER PROCESS FOR SIMULTANEOUS FORMATION OF INTEGRAL CONTACT STUDS AND INTERCONNECT LINES

BACKGROUND OF THE INVENTION

1. Field of the Invention

The present invention is generally related to the manufacture of semiconductor devices and, more particularly, to a process of making tungsten contact studs without etching oxide or oxide-etch stop and forming tungsten liners for interconnection metallurgy. The invention also relates to providing an improved single metallurgical system for forming both ohmic as well as high- and low-barrier Schottky contacts and an integral metallurgical structure comprised of interconnection lines and contact or interlevel via studs.

2. Description of the Prior Art

An integrated circuit (IC) generally includes a semiconductor substrate in which a number of device regions are formed by diffusion or ion implantation of suitable dopants. This substrate usually involves a passivating and an insulating layer required to form different device regions. The total thickness of these layers is usually less than one micron. Openings through these layers (called contact holes) allow electrical contact to be made selectively to the underlying device regions. A conducting material is used to fill these holes, called via studs, which then make contact to semiconductor devices.

One of the techniques for making via studs employs a selective tungsten process. In this method, tungsten plugs are made by selective deposition in the contact holes. However, the deposition is through nucleation phenomenon which is difficult to control, resulting for example in missing studs or tungsten being deposited at unwanted sites. Additionally, during processing fluorine entrapment and silicon encroachment may take place resulting in poor circuit yield and low reliability.

Another process for making plugs is the Damascene method. In this method a layer of alumina and a layer of an oxide insulator is deposited, contact holes aligned to the semiconductor devices are etched, a blanket layer of aluminum metallurgy or tungsten is deposited, and then the excess metal is removed by etching or by chemical-mechanical polishing. The layer of alumina acts as an etch barrier while oxide insulator is being etched. The alumina layer is subsequently removed by a suitable etchant. However, a problem with this method is the undercut of alumina where tungsten is deposited by chemical vapor deposition (CVD), reducing the separation between the adjacent studs, thereby causing leakage or shorts.

Various aspects of via stud metallurgy are described in U.S. Pat. Nos. 4,933,303 to Mo, 4,855,252 to Peterman et al., 4,879,257 to Patrick, and 4,721,689 to Chaloux et al. Mo discloses a process in which metal lines and studs are processed in two different steps. In the Mo process, metal planarization is through selective tungsten deposition which is known to suffer from repeatability. Peterman et al. disclose a process in which metal is deposited by plain evaporation or sputtering into a deep cavity. This approach causes seams in the metal, and blanket Reactive Ion Etch (RIE) for planarization will preferentially attack along these seams, most probably chewing out the metal from the stud area. Patrick discloses a process of making studs only. Chaloux et al. discloses a process wherein the stud is defined by Damascene process and the metal line pattern is defined in separate process steps by ion etching. The Chaloux et al. process, like that of Mo, involves oxide deposition after the metal lines are defined. This method is known to suffer from voids in the oxide between the closely spaced metal lines. Thus, despite repeated efforts in the prior art, problems of leakage, short circuits, etc., remain and better methods for making contact studs need to be developed.

SUMMARY OF THE INVENTION

It is an object of the present invention to provide a unique method for fabricating a reliable, high yield, high density semiconductor structure having low contact resistance, high conductance via studs for making contacts to semiconductor devices and interconnections.

A further object of the present invention is to form tungsten studs making low resistance thermally stable ohmic or Schottky contacts to active devices on a semiconductor substrate, wherein the contact studs and interconnect wiring are simultaneously formed as an integral unit, substantially coplanar with insulating films on said substrate.

The invention employs a unique method where contact studs of a triplex metallurgical structure are first defined. The triplex metallurgical structure includes an ohmic layer, a barrier layer and a sacrificial layer. Then, a blanket layer of insulator is deposited and polished, or etched, or both, until the stud metallurgy is exposed. The sacrificial layer is then etched out, leaving holes self-aligned to the contacts and to the ohmic and the barrier layers. A blanket layer of CVD tungsten is then deposited and the substrate is polished, or etched, or both, to remove excess tungsten.

The invention also provides a process for forming metal contact studs simultaneously with patterned interconnection lines which are self-aligned to each other and also to semiconductor contacts. This vertical integration is achieved by depositing a layer of insulator just prior to the step of etching the sacrificial layer as mentioned above. An interconnection pattern is defined photolithographically on top of this insulator, and the insulator is etched until the metallurgy of the contact studs is exposed. The sacrificial layer of the contact studs is then etched away. A relatively thin layer of CVD tungsten is then deposited, followed by deposition of a conductive metal. The wafer is then polished, etched, or both, to remove the excess metallurgy, thus leaving behind a simultaneously formed, tungsten lined, self-aligned interconnection lines and contact studs as an integral structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS THE INVENTION

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the methods and materials described herein are preferred. Unless mentioned otherwise, the techniques employed or contemplated herein are standard methodologies well known to one of ordinary skill in the art. The materials, methods and examples are only exemplary and not limiting.

Figure 1:
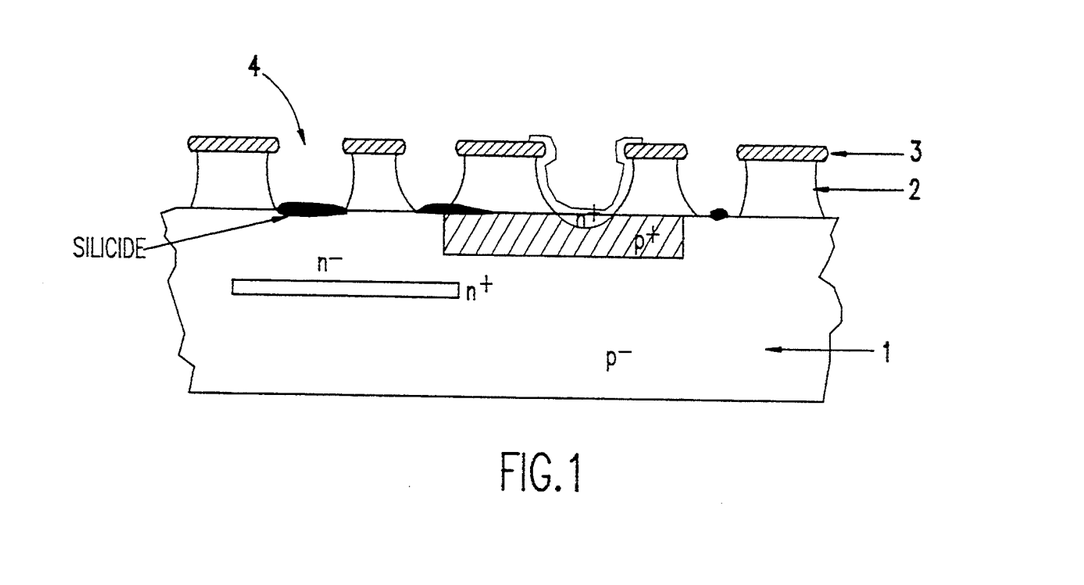
FIGS. 1 and 2 are simplified cross-sectional views of conventional semiconductor substrates for a typical bipolar transistor device structure and for a typical field effect transistor (FET) device structure, respectively.
Figure 2:
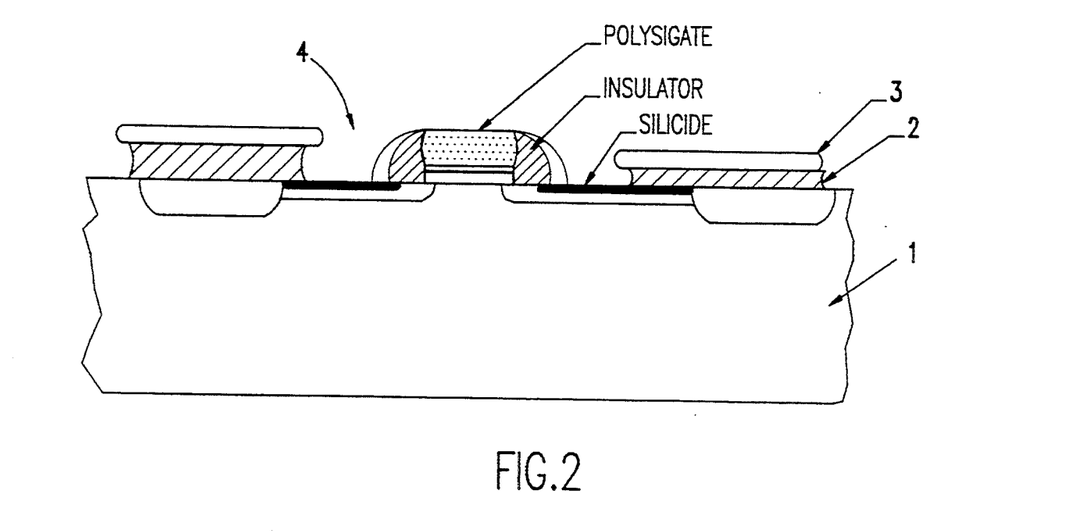

Referring now to the drawings, wherein like reference numerals represent the same or similar parts throughout, and more particularly to FIGS. 1 and 2, there are shown respectively conventional bipolar and Field Effect Transistor (FET) structures to illustrate contact hole structures. In the bipolar structure shown in FIG. 1, a p− substrate 1 has formed therein n−, p+ and n+ regions by known techniques to produce a conventional NPN bipolar transistor structure. Over the surface of the substrate, a insulation layer 2 and a passivation layer 3 are deposited through which holes 4 have been formed for purposes of making electrical contact with collector, base and emitter regions of the bipolar transistor structure. Similarly, in FIG. 2, an FET structure has been formed in the substrate 1 wherein holes 4 in the insulation layer 2 and device passivation layer 3 have been formed for the purposes of making electrical contact with source and drain regions of the FET structure. Obviously, other examples will suggest themselves to those skilled in the art where electrical contact is required to be made to a semiconductor structure as, for example, Schottky barrier contacts.

The present invention includes defining on a substrate, which has been processed to the point of being ready for the contact stud metallurgy such as shown in FIGS. 1 and 2, a lift-off stencil depicting the required stud pattern and aligned to the underlying semiconductor device contacts, and then Ti/Cr—$CrO_x$/Al—Cu metallurgy is deposited by evaporation. The term Cr—$CrO_x$ as used herein represents chromium containing chromium oxide. After lift-off of the unwanted material, a blanket layer of silicon dioxide insulator is deposited and the substrate is then chemically-mechanically polished until the top of the contact studs are exposed. The sacrificial aluminum alloy is then chemically etched out, leaving behind a pattern of holes in the insulating layer while the semiconductor surface is protected by the Ti/Cr—$CrO_x$ layers. A thin layer of Ti and tungsten is sputter deposited to act as adhesive and seed layers for the subsequent CVD tungsten deposition. After CVD tungsten deposition is complete, the substrates are chemically-mechanically polished to remove excess metals. This leaves a pattern of tungsten studs self-aligned to the device contacts.

The advantage of this process is that the semiconductor surface never comes in contact with any reactive chemicals, since it is protected by Ti and Cr—$CrO_x$ films. This also prevents any undesirable effects of the CVD tungsten, such as silicon encroachment. The added chrome further restricts any seepage of tungsten hexafluoride into the silicon surface. A reliable low ohmic contact is achieved, because the contact metallurgy of titanium is deposited at the very beginning.

Figure 3:
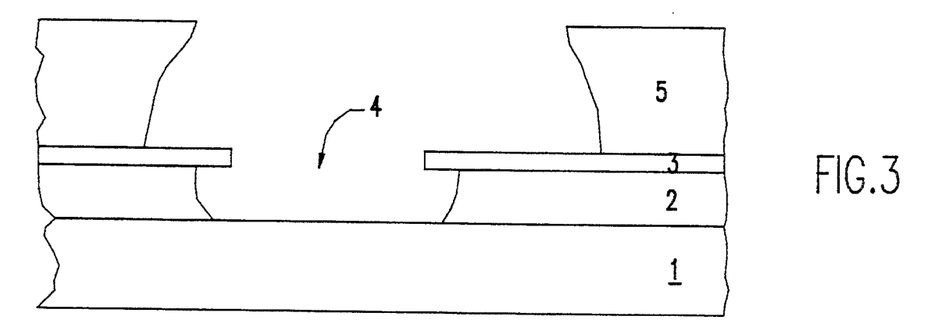
FIGS. 3 to 11 are detailed cross-sectional views through a semiconductor contact as the substrate progresses through a sequence of processes according to the present invention to define low ohmic contact solid tungsten via studs.

The process is illustrated beginning with FIG. 3. In FIG. 3, the substrate 1 represents a typical silicon wafer in which a plurality of semiconductor devices such as FET transistors, bipolar transistors, Schottky diodes, non-volatile devices, or a combination of them, are previously fabricated as represented in FIGS. 1 and 2. The device insulation and passivation layers 2 and 3 have holes 4, only one of which is illustrated for the sake of simplification, to make contact to semiconductor devices underneath. A lift-off stencil 5 is defined by a known lift-off technique. The stencil pattern corresponds to the set of contact holes 4 in a semiconductor substrate. If desired, this pattern may be personalized to have openings corresponding only to a select group of semiconductor contact holes 4.

Figure 4:
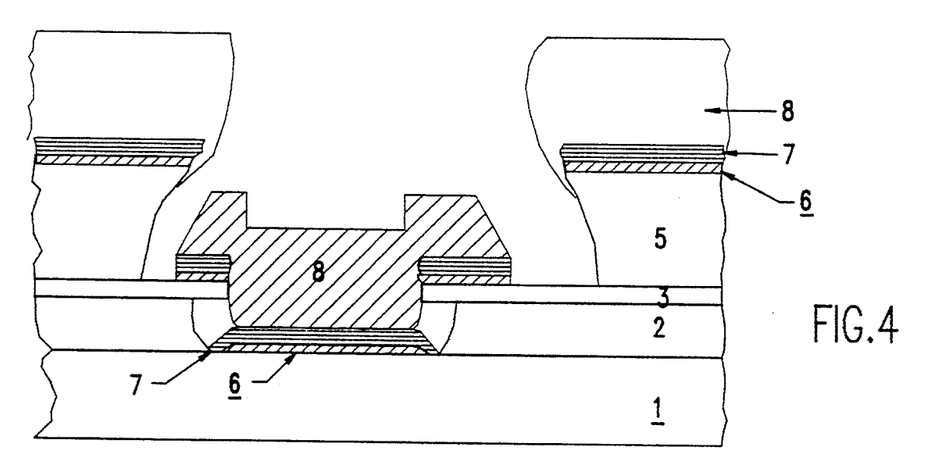

A sequence of metallurgy comprised of Ti layer 6, Cr—$CrO_x$ layer 7 and Al—Cu layer 8 is deposited by standard evaporation techniques, as shown in FIG. 4. Titanium is used to obtain low contact resistance on n-silicon and also for low barrier Schottky diodes, whereas Cr—$CrO_x$ acts as a diffusion barrier between titanium and the Al—Cu alloy. Cr—$CrO_x$ is deposited by evaporating Cr while bleeding water vapor to a partial pressure of 1E-5 to 8E-5 Torr. This process is known in the art and described in such publication as U.S. Pat. No. 4,214,256 to Dalal et al.

Figure 5:
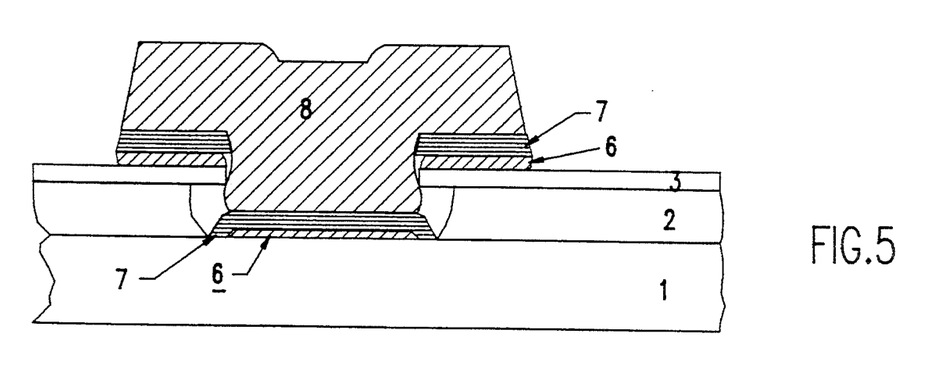

The total thickness of this composite metallurgy is adjusted by the aluminum alloy 8 to a total height of approximately 1.5× the predetermined height of the stud. The polymer of the lift-off stencil 5 is dissolved by standard methods as employed in various lift-off techniques, leaving an array of contact studs, represented by the single stud 8 shown in FIG. 5.

Figure 6:
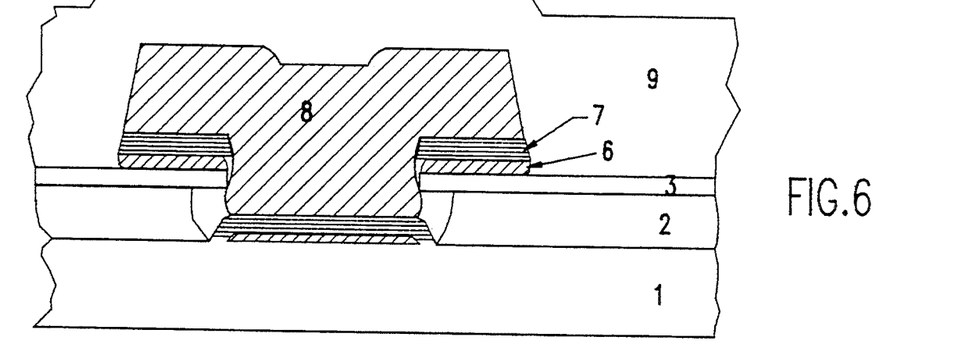
Figure 7:
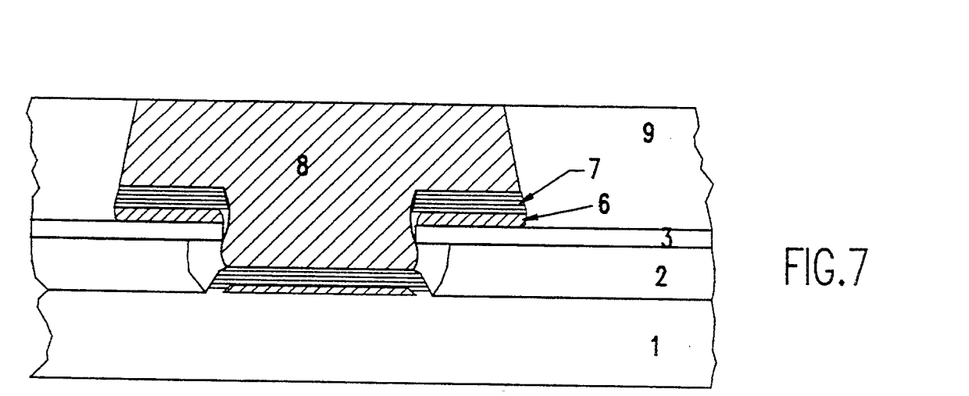

A layer of oxide, nitride or polyimide insulation 9 is then deposited to a thickness of 1.1× the predetermined stud height, as shown in FIG. 6. The wafer is then planarized by any of the known processes, e.g., chemical-mechanical polishing, RIE or a combination of them, to the desired stud height, as shown in FIG. 7.

Figure 8:
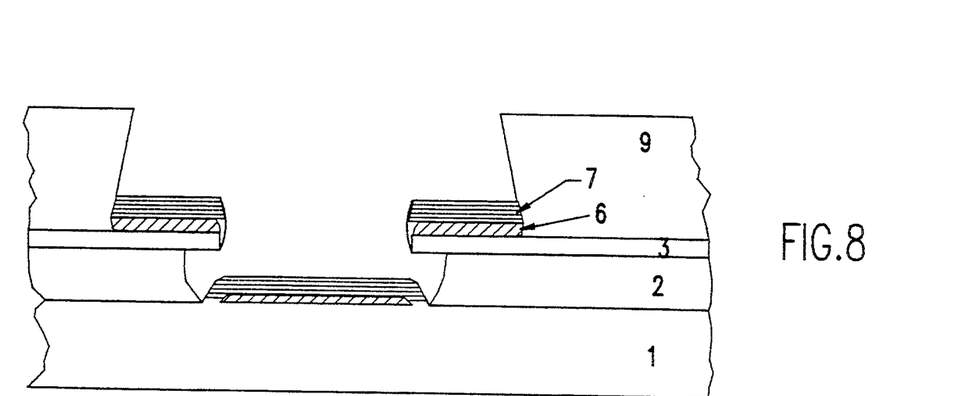
Figure 9:
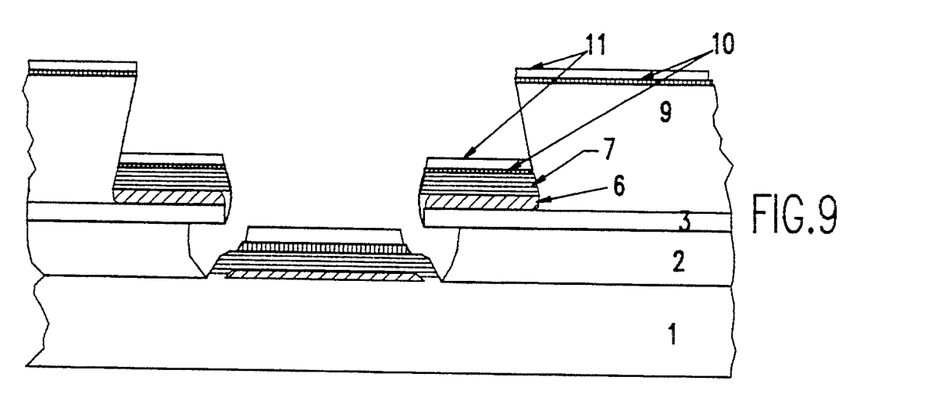
Figure 10:
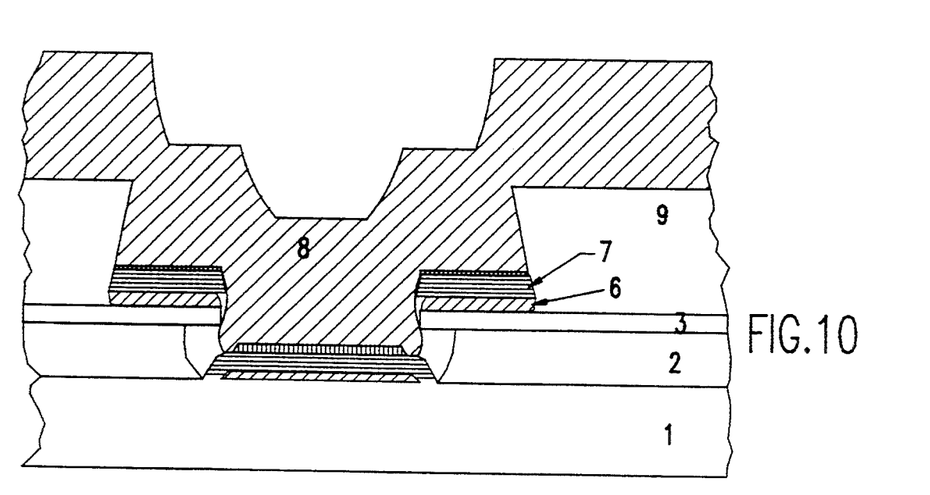
Figure 11:
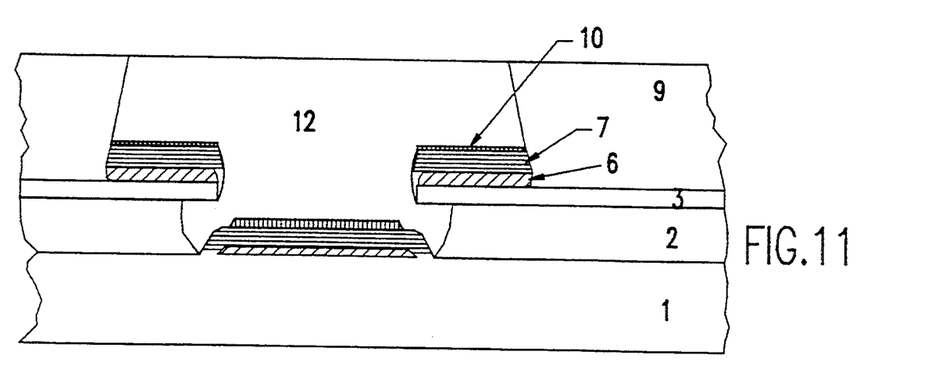

In one embodiment of the present invention, the aluminum alloy 8 is etched out by standard phosphoric-nitric acid etch, leaving intact the Ti/Cr—$CrO_x$ layers and an array of holes in the insulation layer 9, as shown in FIG. 8. Then, a thin layer of titanium 10 and tungsten 11 is physically vapor deposited by thermal evaporation or sputtering in FIG. 9. The titanium layer 10 is required here to make a low resistance contact with Cr—$CrO_x$, and the tungsten layer 11 provides a seed layer for the next step of CVD tungsten deposition 12, shown in FIG. 10. The CVD tungsten layer 12 is deposited with any of the known methods to a thickness of 0.9× the thickness of the insulator layer 10, and the excess tungsten is removed by chemical-mechanical polishing to produce the structure shown in FIG. 11. This makes an array of planarized tungsten plugs 12 self-aligned and making low resistance ohmic contacts to semiconductor devices while protecting the semiconductor surface from harsh in-process chemical reactions causing silicon encroachment.

In another embodiment of the invention, after chemical-mechanical polishing of the insulator in the initial step described above, a blanket layer of, for example, $SiO_2$ insulator is deposited, and an interconnection line pattern is defined in a multi-layer structure of photoresist. The line pattern is etched into the insulator until the top surface of the studs are exposed. The sacrificial aluminum alloy is then chemically etched out, leaving cavities corresponding to contact stud pattern and self aligned to device contact holes. A thin layer of titanium and tungsten is sputter deposited to act as adhesive and seed layer followed by a thin layer of CVD tungsten deposition. Desired thickness of aluminum alloy is then deposited and the excess metallurgy is polished away by a chemical-mechanical polishing method. This method makes an integral structure of aluminum alloy contact stud and interconnection wire having tungsten lining on the sides and at base.

Figure 12:
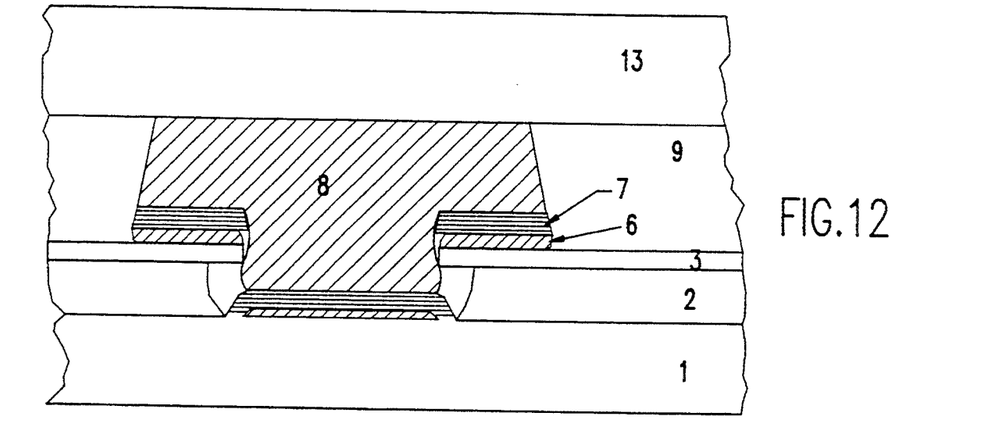
FIGS. 12 to 17 are detailed cross-sectional views depicting process steps, continuing from the point shown in FIG. 7, to simultaneously fabricate contact studs and interconnection lines as an integral structure.

In this embodiment of the present invention, the semiconductor surface protection and ohmic contact formation is still with Ti and Cr—$CrO_x$ layers. The process steps up to FIG. 7 are exactly the same. With reference to FIG. 12, a layer of insulation 13, e.g., oxide, nitride, polyimide or any combination of them, is deposited. The thickness of this insulation layer 13 is about 1.2× predetermined thickness of the interconnection lines.

Figure 13:
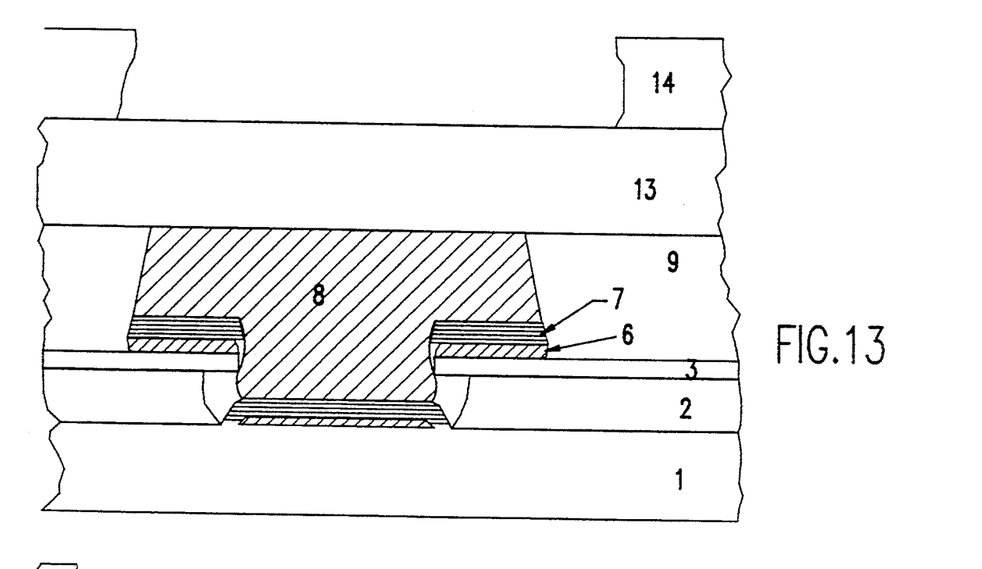
Figure 14:
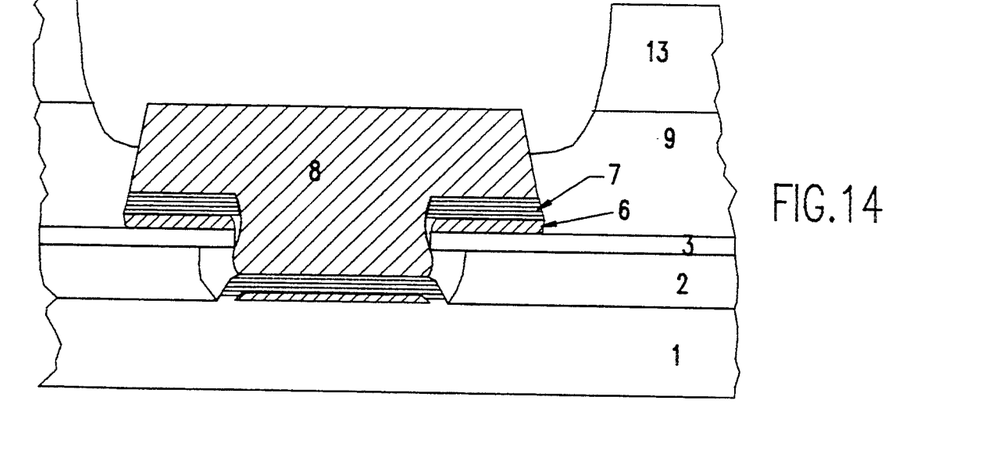
Figure 15:
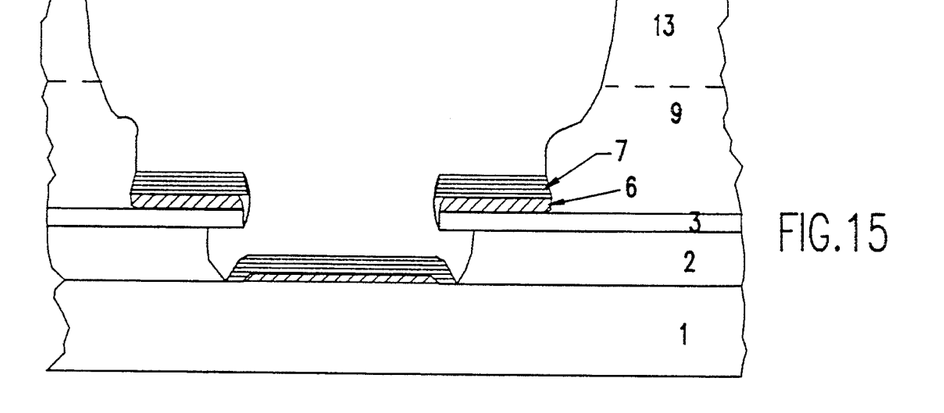
Figure 16:
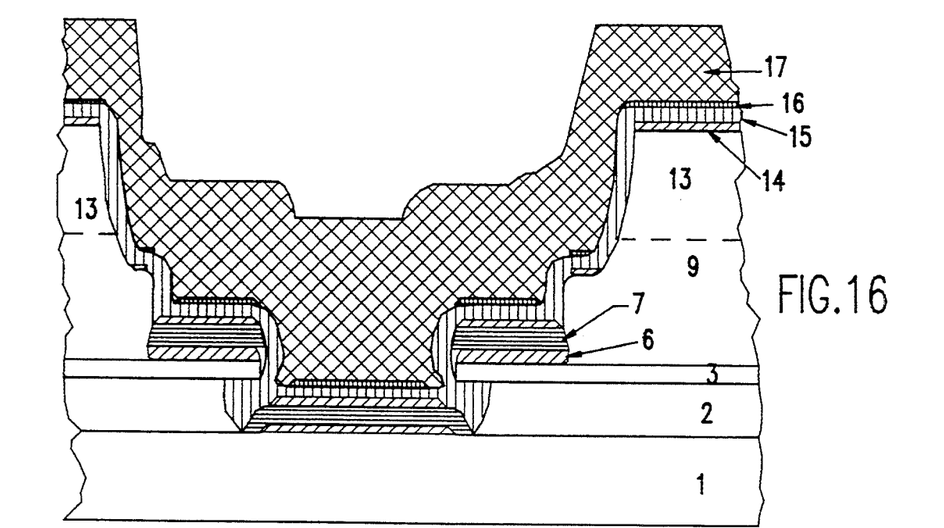
Figure 17:
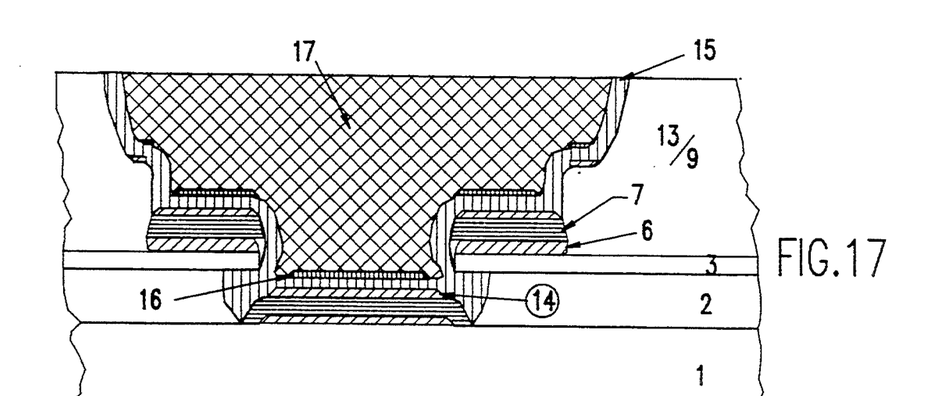
Figure 18:
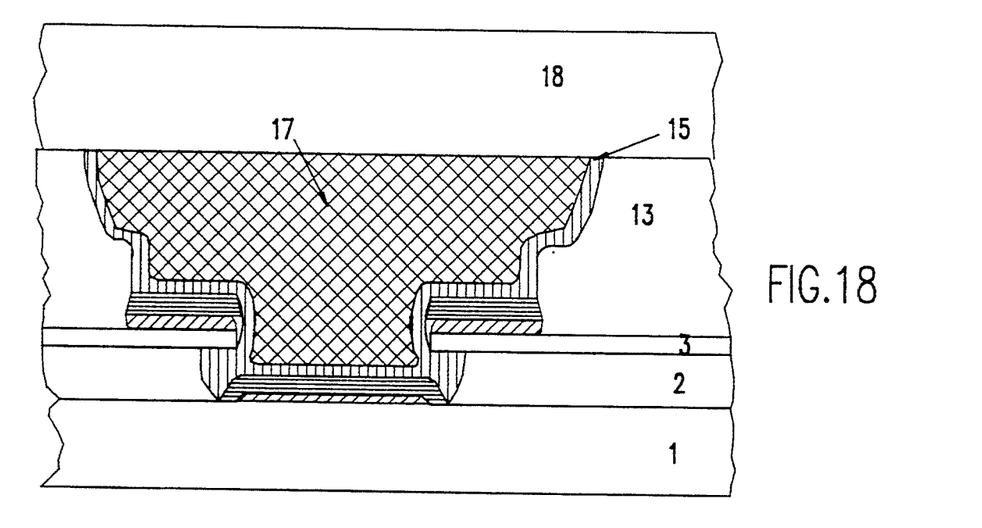
FIGS. 18 to 21 are detailed cross-sectional views depicting process steps, continuing from the point shown in FIG. 17, to simultaneously fabricate further, upper level integral contact studs and interconnection lines.

A pattern of interconnection lines is defined photolithographically on top of this insulation layer 13 using a multi-layer resist system 14, as shown in FIG. 13. The insulation layer 13 is then reactively etched until the top surface of the underlying stud 8 is exposed. A slight over-etching is desirable to account for any variation in insulation thickness or its etch rate. The multi-layer resist 14 is stripped by oxygen plasma leaving the structure shown in FIG. 14. Then, the exposed aluminum 8 is etched out by phosphoric-nitric acid in FIG. 15. The structure shown in FIG. 16 is built up beginning with a thin layer of titanium 14 and tungsten which is sputter deposited for a seed layer, followed by deposition of approximately 0.1-0.3 micron of CVD tungsten 15. A thin layer of titanium 16, and an alloy of Al—Cu 17 is next physical vapor deposited. The thickness of aluminum-copper alloy 17 is the sum of the interconnection line thickness and the stud thickness. The excess metallurgy is chemical-mechanical polished in FIG. 17. Also, FIG. 17 shows the final configuration in accordance with the present invention comprising an integral contact stud and interconnection line of a conductor metal 17 lined with tungsten 15. Tungsten liner 15 acts as a barrier for alloying of the conductor metal (e.g., Al—Cu alloy here) with silicon of the substrate 1. Tungsten is deposited by CVD which conformally coats any fine crevice in the intricate contact hole geometry, and also provides a coaxial coating of the contact stud, thereby providing an efficient barrier.

Figure 19:
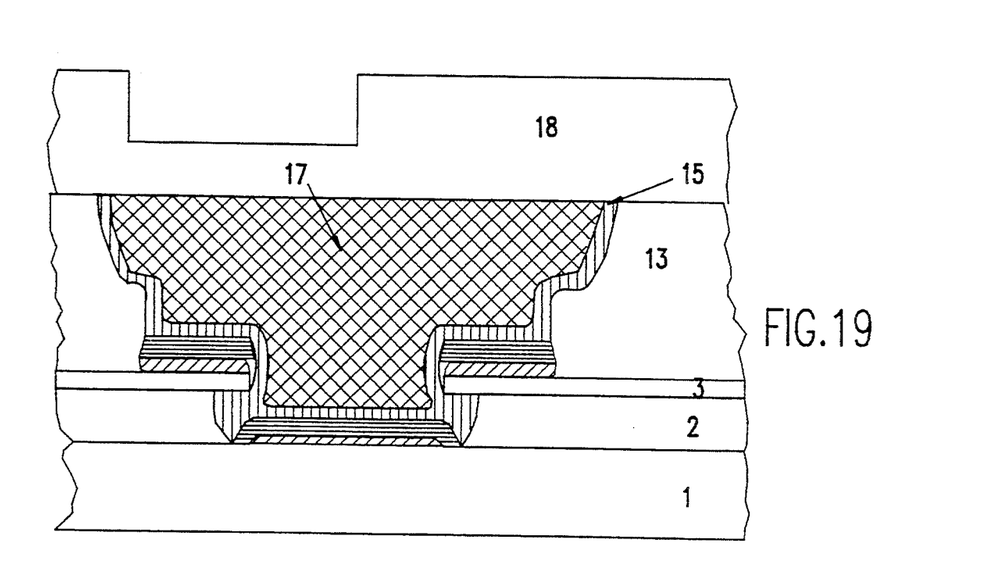
Figure 20:
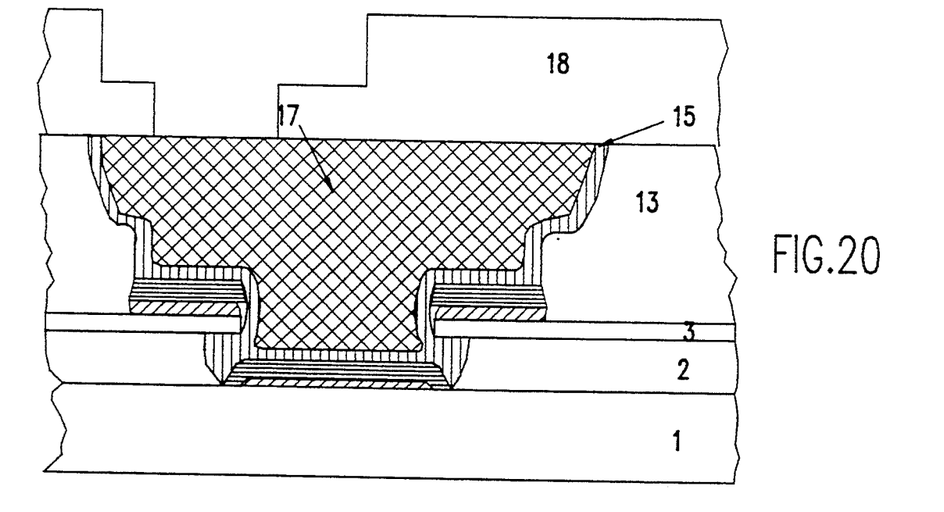
Figure 21:
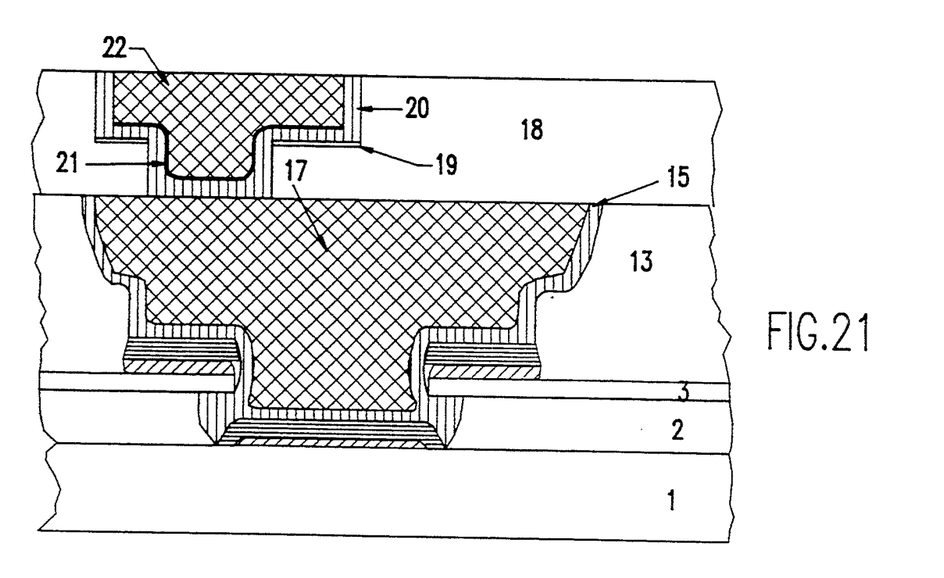

In yet another embodiment of the invention, an integral unit of tungsten lined interconnect wiring over, and together with coaxially tungsten-coated interlevel via studs making contact to lower level interconnections through an insulating layer, is made by photolithographically defining the via stud pattern and reactive ion etching. This is shown in FIGS. 18 through 21. In this embodiment of the present invention, the interconnection lines on higher levels and the via stud connections to interconnection lines on lower levels are fabricated simultaneously as an integral structure. Starting with wafers or substrates processed to the step shown in FIG. 17, an insulating layer 18 with thickness equivalent to about 1.2× the sum of predetermined thicknesses of second interconnection line metallurgy and via stud is deposited in FIG. 18. A second level of interconnection line pattern is photolithographically defined on top of insulator 18, and the insulator is reactively etched to a depth approximately twenty percent thicker than the desired, predetermined interconnection metallurgy thickness, and the resist removed, as shown in FIG. 19. Substrates are recoated with a multilayer resist to define the interlevel via stud pattern. The insulator 18 is further etched in FIG. 20 until the top surface of the metallurgy 17 underneath is exposed, and the resist is then removed. Further process steps of depositing a Ti layer 19, a thin layer 20 of CVD tungsten and a further Ti layer 21 followed by a conductor metallurgy 22 and chemical mechanical polishing the excess metallurgy are in accordance with process steps described above with respect to FIGS. 16 and 17. The interlevel via stud, part of the integral conductor metallurgy 22, has coaxial and basal coatings of tungsten, and the interconnect wire, also part of the integral conductor metallurgy 22, has tungsten lining on exposed edges and at the base.

Figure 22:
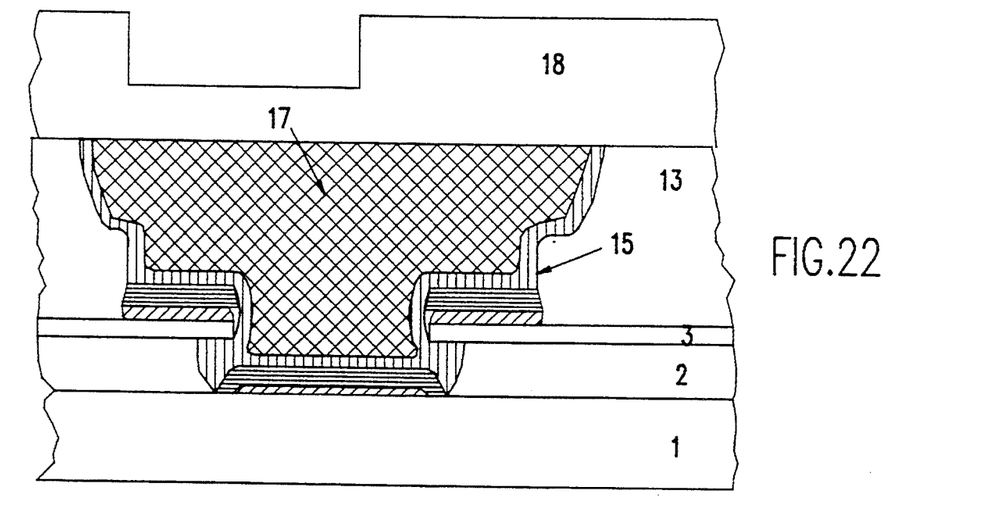
FIGS. 22 and 23 are detailed cross-sectional views depicting alternative process steps, continuing from the point shown in FIG. 17, to simultaneously fabricate further, upper level integral contact studs and interconnection lines.
Figure 23:
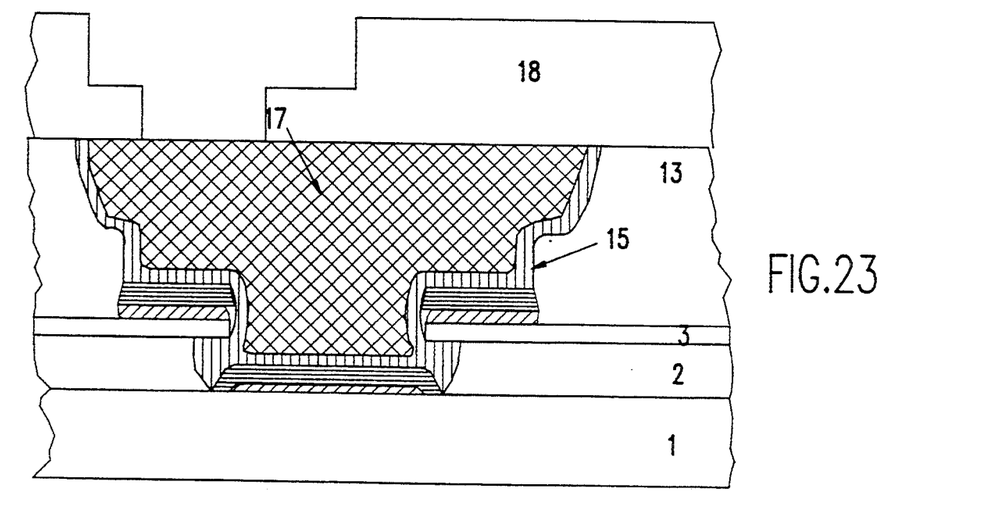

As a variation of the embodiment just described, the integral unit of tungsten lined interconnect wiring over, and together with coaxially tungsten-coated interlevel via studs making contact to lower level interconnections through an insulating layer, is made as shown in FIGS. 22 and 23. In this variation, the interconnection lines on higher levels and the via stud connections to interconnection lines on lower levels are fabricated simultaneously as an integral structure, but with a slightly different order in the processing steps. Starting with wafers or substrates processed to the step shown in FIG. 17, an insulating layer 18 with thickness equivalent to about 1.2× the sum of predetermined thicknesses of second interconnection line metallurgy and via stud is deposited as in FIG. 18. Then in FIG. 22, the via stud pattern is first photolithographically defined on top of insulator 18, and the insulator is reactively etched and the resist removed, as shown in FIG. 22. Substrates are recoated with a multilayer resist to define the interconnection line pattern. The insulator 18 is further etched in FIG. 22 until the top surface of the metallurgy 17 underneath is exposed, and the resist is then removed. Further process steps are in accordance with process steps described above with respect to FIGS. 16 and 17.

It should be apparent that given the guidance and the illustrations set forth herein, alternate embodiments of the processes and structures of the present invention may be suggested to a skilled artisan. For example, titanium containing nitrogen, tantalum or tantalum containing nitrogen could be substituted for Cr—$CrO_x$ as the barrier layer. The insulator could include an organic or inorganic component or a combination thereof. It will therefore be understood that the examples and embodiments described herein are only exemplary and that various modifications or changes in light thereof will be suggested to persons skilled in the art and are to be included within the spirit and purview of this application and scope of the appended claims.

Having thus described our invention, what we claim as new and desire to secure by Letters Patent is as follows:

1. A method of making contact studs which form ohmic or Schottky contacts with active regions of a semiconductor substrate having an insulation layer through which contact holes have been formed exposing said active regions, said method comprising the steps of:

forming a lift-off stencil pattern over said insulation layer having a pattern of holes corresponding to at least some of said contract holes;

depositing in sequence on said lift-off stencil pattern an ohmic layer, a barrier layer and a sacrificial layer to form a triplex metallurgical structure;

removing said stencil layer leaving said triplex metallurgical structure within said at least some of said contact holes defining contact studs;

depositing a blanket layer of insulator over said triplex metallurgical layer and removing the blanket layer of insulator until the contact studs are exposed;

removing the sacrificial layer by etching, leaving holes self-aligned to the contacts and to the ohmic and the barrier layers; and depositing a blanket layer of CVD tungsten.

2. The method recited in claim 1 wherein said ohmic layer is Ti and said barrier layer is $Cr-CrO_x$.

3. The method recited in claim 1 wherein said sacrificial layer is deposited to approximately 1.5× a height of the contact studs.

4. The method recited in claim 1 wherein said blanket layer of insulation is deposited to a thickness of approximately 1.1× a height of the contact studs and said CVD tungsten is deposited to a thickness of approximately 0.9× said height, said method further comprising the step of removing excess tungsten to form solid tungsten contact studs.

5. The method recited in claim 1 further comprising the steps of:

depositing a second blanket layer of insulator prior to the step of removing the sacrificial layer;

photolithographically defining an interconnection on top of the second blanket layer of insulator;

etching the second blanket layer of insulator until the contact studs are exposed and then performing the step of removing the sacrificial layer, leaving holes self-aligned to the contacts and to the ohmic and the barrier layers;

depositing a thin layer of CVD tungsten;

depositing a conductive metal; and removing excess metallurgy leaving tungsten lined, self-aligned interconnection lines and contact studs as an integral structure.

6. The method recited in claim 5 wherein said sacrificial layer is deposited to approximately 1.5× a height of the contact studs and said second blanket layer of insulation is deposited to a thickness of approximately 1.1× a thickness of said interconnection lines.

7. The method recited in claim 5 further comprising the steps of:

depositing a third blanket layer of insulator;

photolithographically defining an upper level of interconnection lines on top of the third blanket layer of insulator;

etching the third blanket layer of insulator to a depth of approximately 20% greater than a thickness of said upper level interconnection lines;

photolithographically defining a pattern of interlevel contact studs interconnecting said first mentioned interconnection lines and said upper level interconnection lines;

further etching the third blanket layer of insulator until contact points to the said first mentioned interconnection lines are exposed;

depositing a thin layer of CVD tungsten;

depositing a conductive metal; and removing excess metallurgy leaving tungsten lined, self-aligned upper level interconnection lines and interlevel via studs as an integral upper level structure.

8. The method recited in claim 5 further comprising the steps of:

depositing a third blanket layer of insulator;

photolithographically defining a pattern of interlevel contact studs interconnecting said first mentioned interconnection lines and said upper level interconnection lines;

etching the third blanket layer of insulator until contact points to the said first mentioned interconnection lines are exposed;

photolithographically defining an upper level of interconnection lines on top of the third blanket layer of insulator;

further etching the third blanket layer of insulator to a depth of approximately 20% greater than a thickness of said upper level interconnection lines;

depositing a thin layer of CVD tungsten;

depositing a conductive metal; and removing excess metallurgy leaving tungsten lined, self-aligned upper level interconnection lines and interlevel via studs as an integral upper level structure.

9. A contact stud making ohmic contact to active areas in a semiconductor substrate, said contact stud being substantially coplanar with an insulator layer having contact holes therein defining locations of contact studs and comprising:

an ohmic layer of metal disposed within said contact holes;

a layer of a barrier material over said ohmic layer;

a layer of titanium over said barrier material; and a CVD layer of tungsten over said titanium layer filling said contact hole to form a solid tungsten contact stud.

10. A contact stud making ohmic contact to active areas in a semiconductor substrate, said contact stud being substantially coplanar with an insulator layer having contact holes therein defining locations of contact studs and comprising:

an ohmic layer of metal disposed within said contact holes;

a layer of a barrier material over said ohmic layer;

a layer of titanium over said barrier material; and a relatively thin CVD layer of tungsten over said titanium layer;

a layer of titanium over said CVD layer of tungsten; and a conductive layer filling said contact hole to form a tungsten lined contact stud.

11. An integral structure of electrical interconnect wiring and contact studs making ohmic or Schottky contact to active areas in a semiconductor substrate, said electrical interconnect wiring and contact studs being substantially coplanar with an insulator layer having a pattern of said interconnect wiring contact holes therein defining locations of contact studs and comprising:

an ohmic layer of a metal disposed within said pattern on electrical wiring and contact holes;
a layer of a barrier material over said ohmic layer;
a first layer of titanium over said barrier layer;
a CVD layer of tungsten over said first layer of titanium;
a second layer of titanium over said CVD layer of tungsten; and
a conductive layer filling said pattern of electrical wiring and contact holes to form an integral tungsten lined electrical interconnect wiring and contact stud structure.

12. An integral structure of electrical interconnect wiring and contact studs making ohmic or Schottky contact to active areas in a semiconductor substrate, said electrical interconnect wiring and contact studs being substantially coplanar with an insulator layer having a pattern of said interconnect wiring contact holes therein defining locations of contact studs and comprising:

an ohmic layer of metal disposed within said pattern of electrical wiring and contact holes, said ohmic layer is titanium;
a layer of a barrier material over said ohmic layer, said barrier layer is composed of chromium containing chromium oxide;
a CVD layer of tungsten over said barrier layer;
a layer of titanium over said CVD layer of tungsten; and
a conductive layer filling said pattern of electrical wiring and contact holes to form an integral tungsten lined electrical interconnect wiring and contact stud structure, said conductive layer is an aluminum/copper alloy.

13. An integral structure of electrical interconnect wiring and via studs making electrical contact to lower level tungsten lined interconnect lines, said electrical interconnect wiring and via studs being substantially coplanar with an insulator layer having a pattern of said interconnect wiring via holes therein defining locations of via studs and comprising:

a first titanium layer disposed within said pattern on electrical wiring and via holes;
a CVD layer of tungsten over said first titanium layer;
a second titanium layer over said tungsten layer; and
a conductive layer filling said pattern of electrical wiring and contact holes to form an integral tungsten lined electrical interconnect wiring and via stud structure.

14. A method of making contact studs which form ohmic or Schottky contacts with active regions of a semiconductor substrate having an insulation layer through which contact holes have been formed exposing said active regions, comprising the steps of:

forming a lift-off stencil pattern over said insulation layer having a pattern of holes corresponding to at least some of said contact holes;
depositing in sequence over said lift off stencil pattern an ohmic layer, a barrier layer and a sacrificial layer to form a triplex metallurgical structure;
removing said stencil layer leaving said triplex metallurgical structure within said contact holes;
depositing a blanket layer of insulator over said triplex metallurgical structure;
removing a portion of said blanket layer of insulator to expose said triplex metallurgical structure; and
removing the sacrificial layer of said triplex metallurgical structure to leave holes self-aligned to the contacts and to the ohmic and barrier layers.

15. The method recited in claim 14 further comprising the steps of:

depositing tungsten over said insulator and within said holes self-aligned to the contacts and to the ohmic and barrier layers; and
removing a portion of said tungsten deposited during said depositing step, said portion removed during said removing step being tungsten deposited over said insulator.

16. The method recited in claim 7 further comprising the step of depositing a layer of titanium on said thin layer of CVD tungsten after said step of depositing a thin layer of CVD tungsten and before the step of depositing a conductive metal.

17. The method recited in claim 8 further comprising the step of depositing a layer of titanium on said thin layer of CVD tungsten after said step of depositing a thin layer of CVD tungsten and before the step of depositing a conductive metal.

* * * * *